United States Patent
Yang

(10) Patent No.: US 6,909,167 B2
(45) Date of Patent: Jun. 21, 2005

(54) COUPLING SPACED BOND PADS TO A CONTACT

(75) Inventor: Jicheng Yang, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/845,983

(22) Filed: May 14, 2004

(65) Prior Publication Data

US 2004/0212052 A1 Oct. 28, 2004

Related U.S. Application Data

(62) Division of application No. 10/426,571, filed on Apr. 30, 2003, now Pat. No. 6,768,187, which is a division of application No. 10/215,571, filed on Aug. 8, 2002, now Pat. No. 6,580,160, which is a division of application No. 09/437,870, filed on Nov. 10, 1999, now Pat. No. 6,453,547.

(30) Foreign Application Priority Data

Aug. 17, 1999 (SG) ............................. 9903986-8

(51) Int. Cl.$^7$ .................. H01L 23/495; H01R 43/00
(52) U.S. Cl. ................... 257/668; 257/672; 29/827
(58) Field of Search ................ 257/666, 669, 257/672, 674, 687, 690, 676, 735, 782–784, 68, 787, 692, 668; 438/118, 123, 125; 29/825, 854, 827, 857

(56) References Cited

U.S. PATENT DOCUMENTS

| | | | | |
|---|---|---|---|---|
| 5,691,567 A | * | 11/1997 | Lo et al. ...................... | 257/675 |
| 6,104,084 A | * | 8/2000 | Ishio et al. .................. | 257/666 |
| 6,453,547 B1 | * | 9/2002 | Yang ............................ | 29/827 |
| 6,580,160 B2 | * | 6/2003 | Yang ........................... | 257/672 |
| 6,768,187 B2 | * | 7/2004 | Yang ........................... | 257/672 |

* cited by examiner

Primary Examiner—Alonzo Chambliss
Assistant Examiner—M. Baunson
(74) Attorney, Agent, or Firm—Trop, Pruner, Hu, P.C.

(57) ABSTRACT

Two dice may be provided within a single package so that one pin and associated leadfinger may be coupled to bond pads on different dice. This may mean that two different bond pads on different dice are coupled, for example by wirebonding, to the same leadfinger. An adhesive tape may be secured so as to bridge the two dice. One or more conductive traces are formed on the upper side of the adhesive tape and adhesive is provided on the other side to secure the tape to the two dice. As a result, wire bonds may be made from a pad on one die to a trace and then from the opposite side of the trace to a leadfinger. At the same time, a wire bond may be made from a pad on the other die to the same leadfinger. In another embodiment, an adhesive tape with a conductive trace on it may be used as a wire bond bridge to join spaced bond pads on a single chip.

8 Claims, 3 Drawing Sheets

COUPLING SPACED BOND PADS TO A CONTACT

This is a divisional of prior application Ser. No. 10/426,571, filed Apr. 30, 2003, now U.S. Pat. No. 6,768,187, which is a divisional of prior application Ser. No. 10/215,571, filed Aug. 8, 2002, now U.S. Pat. No. 6,580,160, which is a divisional of prior application Ser. No. 09/437,870, filed Nov. 10, 1999, which issued on Sep. 24, 2002 as U.S. Pat. No. 6,453,547.

BACKGROUND

This invention relates generally to packaging integrated circuit devices.

In some cases it is desirable to provide two integrated circuit devices inside a single package. Sometimes, it may not be feasible to integrate the components of both integrated circuits into a single integrated circuit. Thus, two integrated circuit devices may be combined within a single package to give combined capabilities at a plurality of output pins.

At times, signals from pads on the two different dice need to be coupled to the same output pin. One reason why this may occur is that the number of pins on the package may be limited. Thus, it may be undesirable to have two separate pins that provide or receive the same signal.

The location of bond pads between two dice may not allow direct wirebonding from both pads to a common leadfinger. This is especially likely to occur when two separate dice are used within the same package.

Thus, there is a need for a way to allow spaced apart bond pads to be coupled to the same contact.

SUMMARY

In accordance with one aspect, a method of electrically coupling first and second bond pads on different chips to the same contact includes positioning a conductive trace on a support between the different chips. The first bond pad is coupled to the trace. The trace is coupled to the contact. The second bond pad is then coupled to the contact.

Other aspects are set forth in the accompanying detailed description and claims.

DETAILED DESCRIPTION

Figure 1:
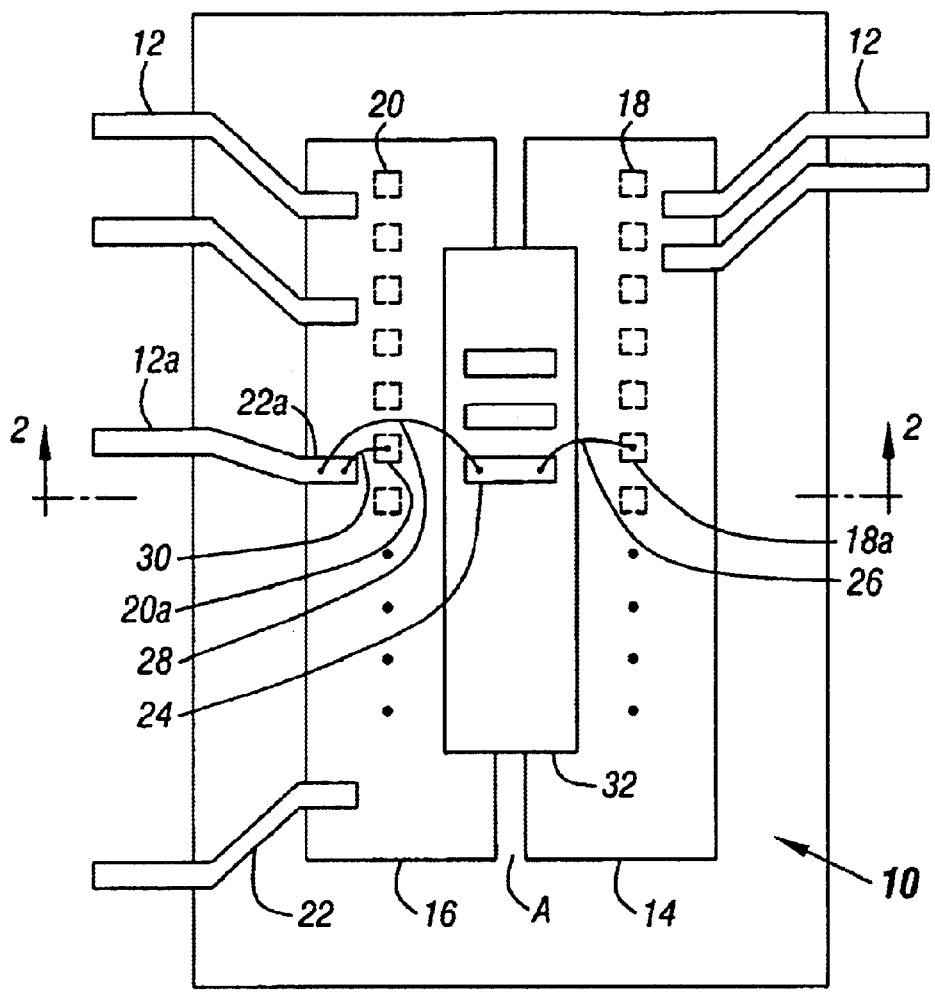
FIG. 1 is a greatly enlarged top plan view of one embodiment of the present invention.

Referring to FIG. 1, an integrated circuit package 10 may contain a pair of chips 14 and 16. In one embodiment of the present invention, each chip may be a memory array. It may be desirable to couple some of the bond pads 18 and 20 on each chip to the same leadfinger 22a for connection to the same external pin 12a. This may be useful for pins that provide output or input signals for the pair of dice.

Each chip includes bond pads 18 or 20 which may be coupled by wire bond wires 30 to leadfingers 22 and pins 12.

A bond pad 18 on the die 14 may be coupled to a leadfinger 22a on the die 20 using an adhesive tape 32. The adhesive tape 32, adhesively secured to both dice, bridges the gap A between the two dice. A plurality of parallel conductive traces 24 may be pre-formed on the tape 32. Thus, a plurality of avenues for interconnection between the two dice are made available by the parallel conductive traces 24.

Thus, for example, the bond pad 18a may be coupled by a wire bond wire 26 to one end of a trace 24. The other end of the trace 24 is coupled by a wire bond 28 to the leadfinger 22a. Similarly, the pad 20a is coupled by the wire 30 to the same leadfinger 22a. In this way, both pads 20a and 18a are coupled to the same pin 12a.

Figure 2:
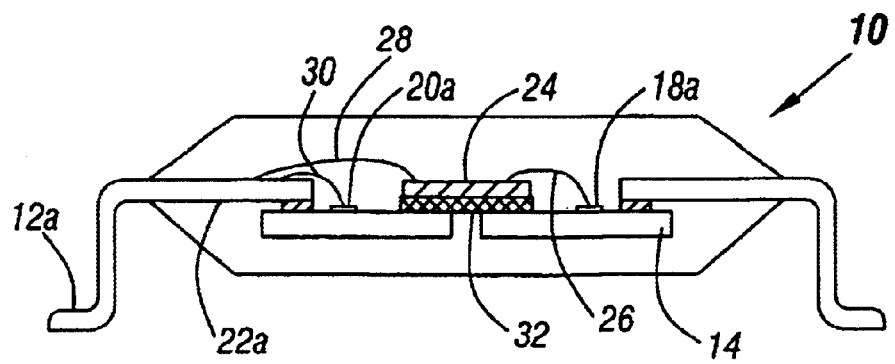
FIG. 2 is cross-sectional view taken generally along the line 2—2 in FIG. 1.

Referring to FIG. 2, the tape 32 may have a plurality of traces 24 deposited thereon on one side of the tape with adhesive on the other side of the tape. The tape may be adhesively secured to both die 14 and 16 with the traces 24 facing upwardly. A die coat may be used to electrically isolate the tape 32 from the chips 14 and 16. The conductive trace may be coated with gold, for example using an immersion technique, while the adhesive layer on the tape is protected. While a plurality of straight-lined conductive traces are illustrated, other shapes are possible as well, including diagonal or curved shapes.

The overall package 10 may be encapsulated in a material 34 as is conventional. The pins 12 extend out of the package 10 and are coupled to the dice 14 and 16 through the leadfingers 22 and the wires 28, 30 and 26. The leadfingers 22 may be coupled to the dice 14 and 20 using lead-on-chip (LOC) tape 36 as is conventional.

Thus, two dice can be contained in the same package and the pin count of the package may be reduced compared to the number of pins that would be needed to provide a separate pin for every single pad. This results in economies and compactness and makes it more feasible to combine multiple dice in a single integrated circuit package.

The tape 32 may be formed by bonding ductile copper foil to thin, flexible dielectric materials. Suitable dielectric materials including polyimide, polyester terephthalate, random fiber aramid, polyamide-imide Teflon®, and polyvinyl chloride. In addition, a non-woven mat of dacron polyester and glass fibers saturated in B-stage epoxy may be used. Copper foils may be directly clad to B-stage material. Suitable adhesives include epoxies, polyesters or acrylics. Epoxy systems include modified epoxies known as phenolic butyrals and nitrile phenolics. Acrylic adhesive systems may be used in high temperature applications. Polyesters can be used with polyester film. Metallic coated films may also be made using advanced vacuum deposition technology to bond copper to polyimide for example. Specially treated polyimide films may have an ultra thin coating of barrier metal applied to promote copper adhesion. The copper may then be electrodeposited onto the film.

Figure 3:
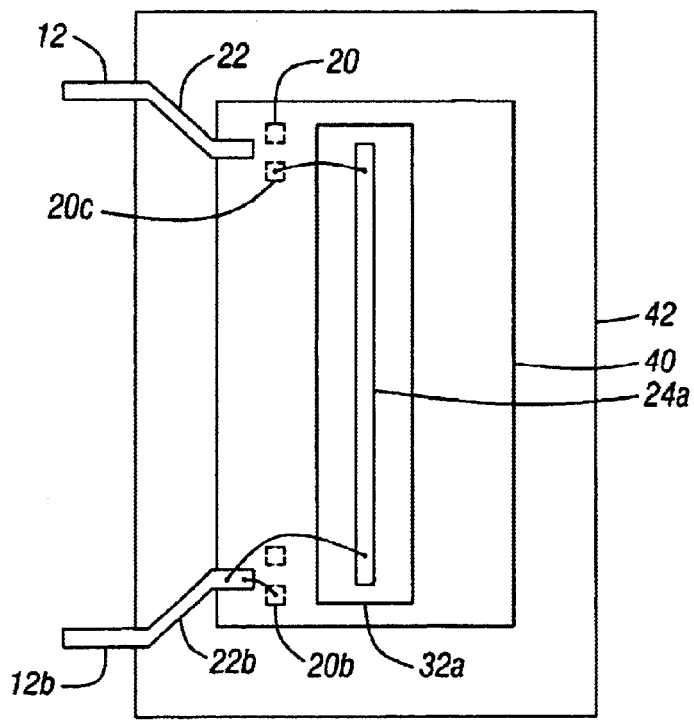
FIG. 3 is a greatly enlarged top plan view of another embodiment of the present invention.

In accordance with another embodiment of the present invention shown in FIG. 3, a die 40 may be contained in a package 42. A pin 12 may connect to a leadfinger 22 proximate to a bond pad 20. In this case, an adhesive tape 32a extends along the length of the die 40 from a leadfinger 22 on one end to a leadfinger 22b, on the other end, coupled to a pin 12b. A connection can be made from a bond pad 20c, widely spaced from the leadfinger 22b, using a conductive trace 24a formed on the tape 32a. For example, the bond pads 20 and 20c may be spaced too far apart to couple them by wirebonding.

Thus, a wire bond is made from the bond pad 20c to one end of the trace 24a. A wire bond is then made from the other end of the trace 24a to the leadfinger 22b. A wire bond may also be made from the bond pad 20b to the leadfinger 22b. In this way, two different bond pads, which are widely spaced apart, may be connected to the same leadfinger.

Figure 4:
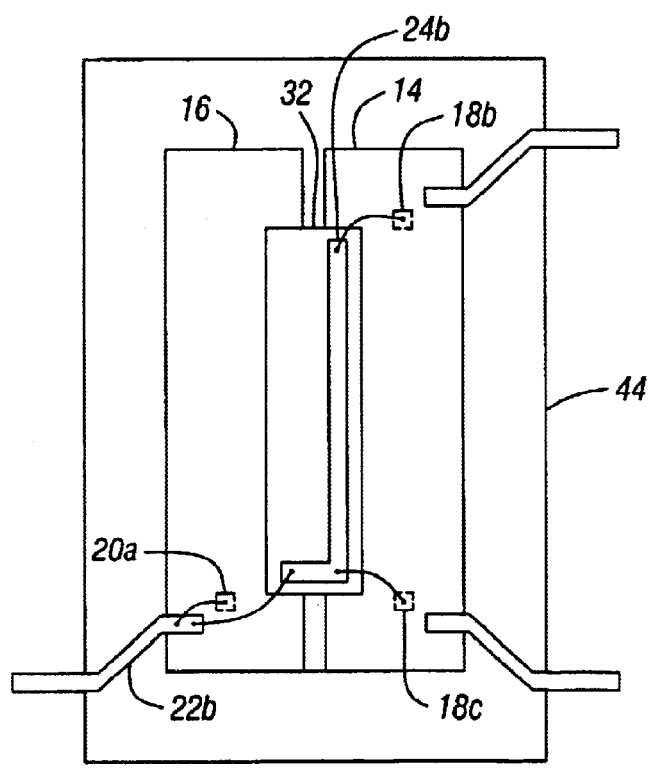
FIG. 4 is a greatly enlarged top plan view of still another embodiment of the present invention.

Referring next to FIG. 4, a package 44 includes a pair of bond pads 18b and 18c on a chip 14. The bond pads 18b and 18c may be coupled to the same leadfinger 22b on a chip 16 using a tape 32 with an L-shaped trace 24b. One end of the longer arm of the trace 24b may be wirebonded to the bond pad 18b. The other end of the longer arm of the trace may be wirebonded to the bond pad 18c. The short arm of the L-shaped trace 24b may be wirebonded directly to the leadfinger 22b. Similarly, the bond pad 20a on the chip 16 may be wirebonded to the trace 22b. In this case, three different wire bond bond pads on two different chips may be coupled to the same trace 22b. Thus, by custom designing the trace 24 on the tape 32, a variety of interconnection arrangements are possible.

Figure 5:
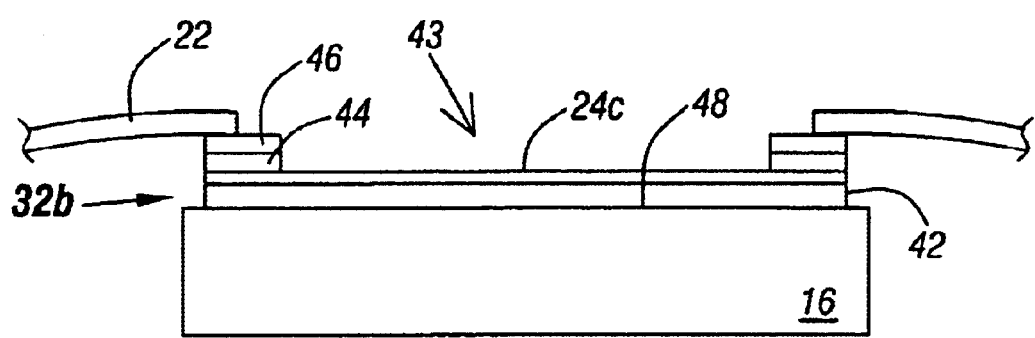
FIG. 5 is a greatly enlarged longitudinal cross-sectional view of another embodiment of the present invention.

Referring now to FIG. 5, still another embodiment of the present invention includes an adhesive tape 32b secured for example to a die 16. The embodiment shown in FIG. 5 is applicable to tape secured to one die as illustrated in FIG. 3 and tape secured across two dice as illustrated in FIGS. 1, 2 and 4.

The tape 32b may be pre-attached to leadfingers 22. The tape 32b includes a tape core 42 covered by a conductive trace 24c which may extend along the entire length of the tape 32a. An insulator 44 may be disposed along two opposed longitudinally displaced edges. Thus, a window 43 is defined immediately between the longitudinal end portions which may be covered by the insulator 44. The insulator 44 may be covered by an adhesive material 46. The adhesive material 46 may be the same as the adhesive at the joint 48 formed by the tape 32b. Conventional adhesives used for lead-on-chip (LOC) tape may be utilized for this function.

Thus, the tape 32b may be pre-taped to the leadfingers 32. The tape 32b may then be applied using the adhesive 48 to the surface of one or more dice 16. Preferably, the tape runs longitudinally along the length of the die 16. This enables free access from either side in the latitudinal direction to bond pads along the die. For reference, in FIG. 1, the longitudinal direction would be up and down on the page.

With the embodiment shown in FIG. 5, the tape 32b may be pre-attached to an interposer such as a leadframe 22 without concern for shorting to the leadframe 22. Namely, the insulator 46 prevents shorting of the trace 24c to the leadframe fingers 22. Thus, in some instances, the tape 32b, shown in FIG. 5, may be more easily applied as a composite unit including a leadframe with the tape pre-attached. Moreover, the tape may not only provide the interconnection function described above, but may also function to secure the leadframe to one or more dice.

The tape 32b may be used in the same fashion as the tape 32. It may act as a bridge, for example, to allow wire bonds to extend from a bond pad to the conductive trace 24c and from the conductive trace 24c to a leadfinger.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An adhesive tape for making connections on integrated circuit chips comprising:

a flexible tape layer having adhesive on one side thereof;

a conductive trace attached to the other side of said flexible tape layer;

a first insulator covering a first portion of said conductive trace;

a second insulator covering a second portion of said flexible tape layer, said first and second portions being spaced from one another and said first and second insulators being spaced from one another; and adhesive secured over said first and second insulators.

2. The tape of claim 1 wherein said tape is adapted to couple an interposer to a die.

3. The tape of claim 1 wherein said interposer is a leadframe.

4. The tape of claim 3 wherein said insulator is positioned between said leadframe and said trace.

5. The tape of claim 1 wherein said flexible tape layer includes a pair of opposed ends, said first and second insulators applied proximately to said ends.

6. The tape of claim 5 wherein a window is formed between said first and second insulators that exposes said conductive trace.

7. The tape of claim 1 wherein said tape is includes including a pair of spaced adhesive covered said first and second insulators and a connecting conductive trace covered flexible tape layer.

8. The tape of claim 1 wherein said conductive trace is exposed, said tape defining a window between said first and second insulators through which said trace is exposed.

* * * * *